United States Patent

Vogel et al.

[11] Patent Number: 5,771,871
[45] Date of Patent: Jun. 30, 1998

[54] IGNITION DEVICE FOR INTERNAL COMBUSTION ENGINES

[75] Inventors: Manfred Vogel, Ditzingen; Werner Herden, Gerlingen; Johann Konrad, Tamm, all of Germany

[73] Assignee: Robert Bosch GmbH, Stuttgart, Germany

[21] Appl. No.: 875,475

[22] PCT Filed: Dec. 21, 1995

[86] PCT No.: PCT/DE95/01825

§ 371 Date: Jul. 7, 1997

§ 102(e) Date: Jul. 7, 1997

[87] PCT Pub. No.: WO96/23139

PCT Pub. Date: Aug. 1, 1996

[30] Foreign Application Priority Data

Jan. 26, 1995 [DE] Germany .................. 195 02 304.8

[51] Int. Cl.[6] .................................................. F02P 3/12
[52] U.S. Cl. ......................................................... 123/655
[58] Field of Search ................... 123/655, 627, 123/656, 643

[56] References Cited

U.S. PATENT DOCUMENTS

| | | | |
|---|---|---|---|
| 4,083,347 | 4/1978 | Grather et al. | 123/655 |
| 4,411,247 | 10/1983 | Kunita et al. | 123/655 |
| 4,993,395 | 2/1991 | Vogel et al. | 123/643 |
| 5,044,349 | 9/1991 | Benedikt et al. | 123/655 |
| 5,265,580 | 11/1993 | Vogel et al. | 123/655 |
| 5,365,910 | 11/1994 | Miyata et al. | 123/627 |
| 5,379,745 | 1/1995 | Vogel et al. | 123/655 |
| 5,564,403 | 10/1996 | Codina et al. | 123/653 |

FOREIGN PATENT DOCUMENTS

| | | | |
|---|---|---|---|
| 0377619B1 | 9/1988 | European Pat. Off. | 123/655 |
| 4032131A1 | 4/1992 | Germany | 123/655 |

*Primary Examiner*—Raymond A. Nelli
*Attorney, Agent, or Firm*—Michael J. Striker

[57] ABSTRACT

An ignition device for internal combustion engines with stationary high-voltage distribution, having at least one ignition coil (11), wherein a controllable switch (12) is disposed in series with the primary winding (10) and is triggerable by a control unit (13), wherein at least one high-voltage break-over diode (HKD), which comprises a plurality of break-over diode chips, is disposed in each secondary-side ignition branch between the high-voltage-side end of the secondary winding (14) and a spark plug (ZK1, ZK2, . . . , ZKn). A switch triggered by the control unit during the ignition coil charging operation makes a conditioning flow possible through the high-voltage break-over diode (HKD), which current in the high-voltage break-over diode floods the blocking region with charge carriers (38) (FIG. 1).

6 Claims, 3 Drawing Sheets 5,771,871

IGNITION DEVICE FOR INTERNAL COMBUSTION ENGINES

PRIOR ART

The invention relates to an ignition device for internal combustion engines with a high-voltage switch. From European Patent Disclosure EP 0 377 619, a circuit arrangement is already known which accomplishes the distribution of the ignition voltage with a high-voltage switch. The ignition distributor arrangement makes do without moving parts and involves what is called a stationary high-voltage distribution. For each spark plug to be triggered, one high-voltage switch is disposed between the high-voltage-side end of the secondary winding of an ignition coil and the spark plug. High-voltage break-over diodes, for instance, of the kind known from German Patent Disclosure DE-OS 40 32 131, are used as high-voltage switches. The high-voltage break-over diode comprises many series-connected break-over diodes, or BODs, and the individual break-over diode chips are stacked one above the other in a cascade circuit and subsequently coated on their circumference with a transparent insulator. With such a high-voltage break-over diode, very exact high voltages can be switched. In the prior art, it is usual for the high-voltage break-over diode to be switched by irradiating the p-n junctions with optical energy. The irradiation with light releases charge carriers in the break-over diodes, thus reducing the break-over voltage. The high-voltage break-over diode is assigned a light-emitting diode, which is triggered by the control unit in accordance with the ignition sequence, so that the high voltage is switched purposefully through to the respective spark plug.

ADVANTAGES OF THE INVENTION

The arrangement according to the invention having the characteristics of the main claim has the advantage over the prior art of not requiring a complicated arrangement of a light-emitting diode or a light-transmitting element from the light-emitting diode to the p-n junctions of the high-voltage break-over diode. Hence the design of the ignition device can be achieved substantially less expensively and more simply.

By the provisions recited in the dependent claims, advantageous further features of and improvements to the ignition device defined by the main claim are possible. It is especially advantageous that by means of a trigger pulse of a thyristor connected in series with the high-voltage break-over diode, a conditioning current can flow without requiring optoelectronic components. Another advantage arises from the division of the high-voltage break-over diode into a first part, which comprises individual BOD chips with a long charge carrier storage time, and a second part, which contains BOD chips with a short charge carrier storage time. Thus after the conditioning current is turned off, the break-over voltage during the high-voltage pulse is reduced in the portion of the high-voltage break-over diode having the chips with the long charge carrier storage time, so that the break-over diode effect is preserved by the "overhead" ignition of the second part of the high-voltage break-over diode.

DRAWING

Exemplary embodiments of the invention are shown in the drawing and described in further detail in the ensuing description. FIG. 1 shows a first exemplary embodiment of the invention; FIG. 2 shows a second exemplary embodiment of the invention; FIG. 3 shows a third exemplary embodiment of the invention; FIG. 4 shows the course of voltage in an ignition coil; and FIG. 5 shows the cross section through an individual BOD chip.

DESCRIPTION OF THE EXEMPLARY EMBODIMENTS

Figure 1:
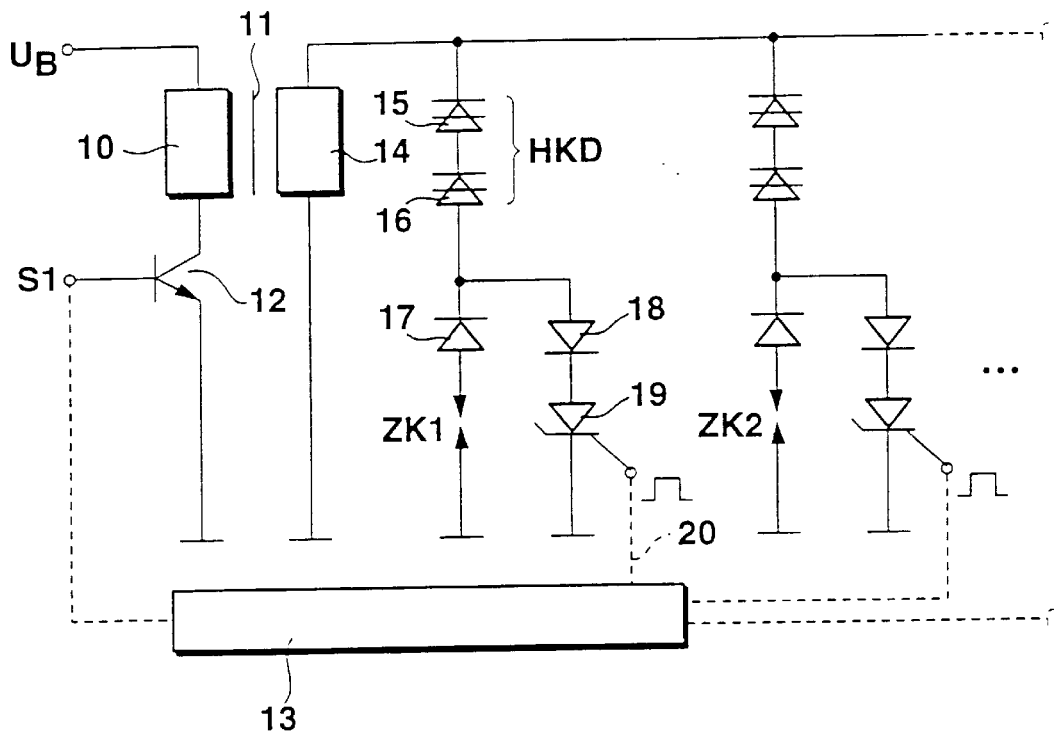

FIG. 1 shows the basic design of an ignition device in accordance with a first exemplary embodiment of the invention. The primary winding 10 of an ignition coil 11 is connected to the supply voltage $U_B$, for instance the battery, not shown, of the engine, and on the other side is connected to ground via a switching transistor 12. The switching transistor 12 is connected to a control unit 13 via a control terminal S1. The high-voltage-side connection of the secondary coil 14 is connected to the spark plugs ZK1 and ZK2, which are connected parallel to one another. In FIG. 1, for the sake of simplicity, only the spark plugs ZK1 and ZK2 are shown, but more spark plugs may also be connected, to match the number of cylinders of the respective engine. Hereinafter only a single high-voltage branch will be described, since the design and function is the same in each high-voltage branch.

A high-voltage break-over diode HKD, which is composed of a first part 15 and a second part 16, is disposed between the high-voltage-side end of the secondary coil 14 and the spark plug ZK 1. The high-voltage break-over diode HKD is connected in the blocking direction. The anode, toward the spark plugs, of the high-voltage break-over diode HKD is connected to the spark plug ZK1 via an oppositely switched diode 17. The diode 17 is a turn-on spark suppression diode. A further high-voltage break-over diode 18 is connected parallel to the series circuit of the diode 17 and the spark plug ZK1 and in series with the high-voltage break-over diode HKD and is connected to ground via a controllable switch 19, which by way of example may be a thyristor, transistor, photosemiconductor, or optocoupler. In this drawing, the controllable switch is a thyristor. The control input of the switch, in this case the gate of the thyristor 19, is connected to the control unit 13 via an operative connection 20, which is shown in dashed lines in FIG. 1.

Figure 4:
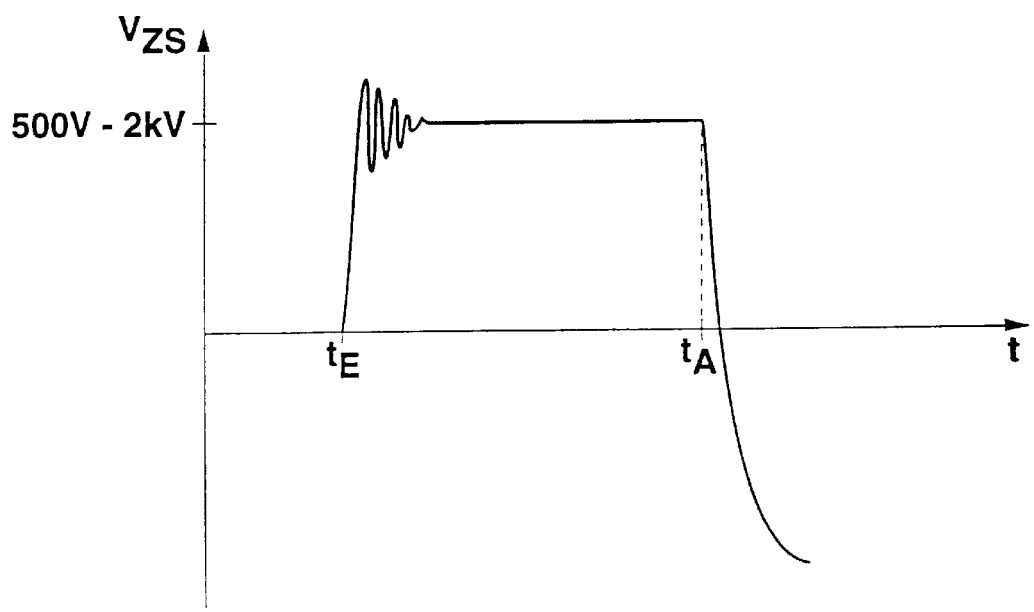
Figure 5:
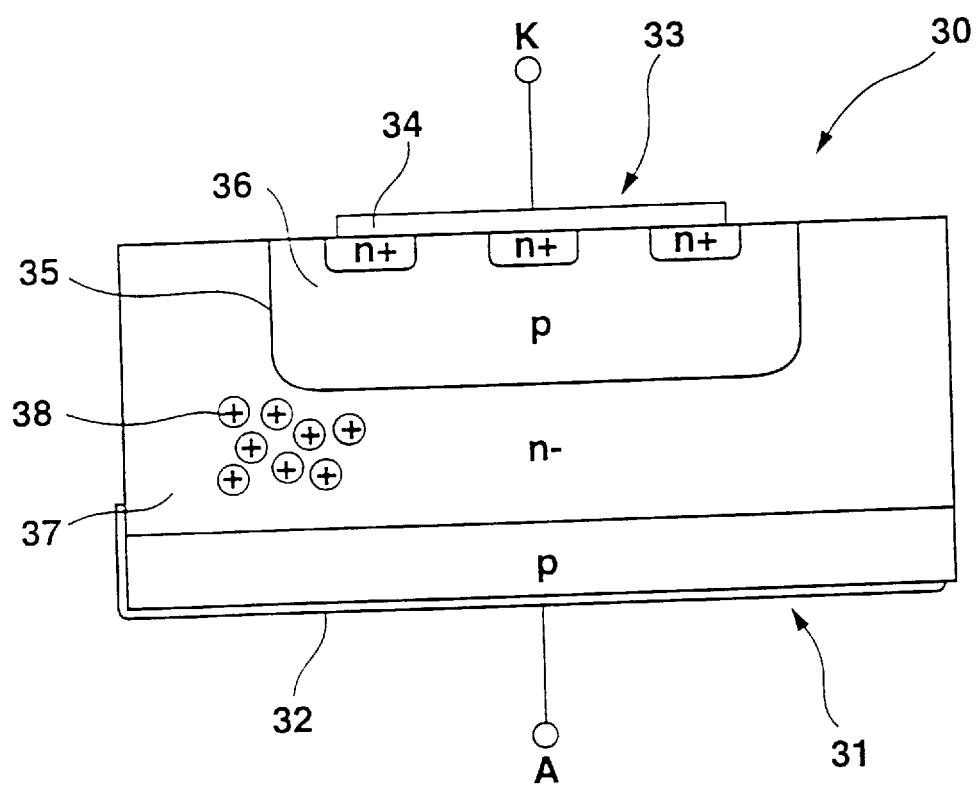

The function of FIG. 1 will now be described in conjunction with FIGS. 4 and 5. The control unit 13 on the basis of detected parameters furnished by sensors, not shown, calculates the appropriate control variables. For instance, the closing time and the instant of ignition are calculated, and on the basis of the calculated variables a suitable control signal is sent to the control input S1 of the switching transistor 12. During the closing time and hence during the charging operation in the ignition coil, the switching transistor 12 is made conducting, so that a current flows through the primary winding 10 of the ignition coil 11. In other words, the ignition coil 11 is charged. A corresponding voltage course in the secondary winding of the ignition coil can be seen in FIG. 4. Here, the secondary voltage course at the ignition coil is shown schematically over time. The time $t_E$ is the turn-on instant for the ignition coil current and thus is the onset of the closing time. With the onset of the closing time, the voltage rises to a value of approximately 0.5 to 2 kV; in this case, there is a positive voltage pulse. During the charging operation in the period from $t_E$ to $t_A$, a positive voltage is thus applied on a secondary side to the high-voltage branch and hence to the high-voltage break-over diode HKD. For this positive voltage, the high-voltage break-over diode is polarized in the reverse or the forward direction, but a flow of current in the direction of the spark plug through the diode 17, which is now located in the blocking direction, is prevented. The high-voltage breakover diode HKD is designed such that in the reverse direction, it is conducting or has only a very low blocking voltage. Via the parallel branch of the series circuit of the diode 17 and the spark plug ZK1 as well, no current can flow when the thyristor 19 blocks, as is the case if there is no trigger pulse. After the coil charging current is turned off at time $t_A$, a high voltage is induced on the secondary side, but compared with the voltage during the closing time it has the opposite, now negative, polarity. The high-voltage breakover diode is high-voltage break-over diode that blocks at 40 kV and which is composed of a first part 15 and a second part 16, each of which blocks 20 kV.

In the arrangement according to the invention, the thyristor 19 is now meant to receive a trigger signal from the control unit 13 via the operative connection 20 shortly before the end of the closing time. By means of this trigger signal to the gate of the thyristor 19, a flow of current through the high-voltage break-over diode HKD via the high-voltage break-over diode 18 and the thyristor 19 is made possible. In the process, the intrinsically blocking region of the high-voltage break-over diode is flooded with charge carriers, and the so-called conditioning current slows. The time for the conditioning current is typically between 5 $\mu$sec and 100 $\mu$sec, since in this period enough charge carriers are released. It is favorable to effect the conditioning current immediately before the end of the closing time. If a high-voltage break-over diode with a long charge carrier storage time is chosen, then the charge carriers are temporarily preserved in the high-voltage break-over diode. In the ensuing, immediately following turn-off of the coil charging current at time $t_A$, the secondary voltage rises abruptly and now, in contrast to the charging operation, has negative polarity. Because of the charge carriers present in the blocking p-n region, the break-over voltage of the high-voltage break-over diode is lowered, and the high voltage is switched through to the spark plug ZK1. The high-voltage break-over diode 18 blocks for the now opposite voltage present. By the purposeful triggering of the thyristor, which is located in the high-voltage branch of the closest spark plug to be fired, an accurate selection of the spark plug and hence the distribution of the high voltage can thus be accomplished. The trigger pulse from the control unit 13 to the gate of the thyristor 19 occurs approximately 100 $\mu$sec before the end of the positive turned-on pulse, or in other words before the end of the closing time. This assures that an adequate flooding of the high-voltage break-over diode with charge carriers takes place. The process of charge carrier release will now be explained for purposes of clarity in conjunction with FIG. 5, which in cross section shows the structure of an individual planar-type break-over diode (BOD) chip. The BOD chip shown is a four-layer diode, which flips from the blocking state to the open state when the voltage between the anode and cathode exceeds a certain value. The individual BOD chip 30 comprises a monocrystalline semiconductor, in particular of silicon, that is approximately 100 to 600 $\mu$m thick and in which the individual layers (p, n, p, n) are introduced by diffusion of dopants. On the underside 31 of the BOD chip, an anode metallizing 32 is applied to enable making the electrical connection. The cathode metallizing 34 is applied to the top 33 of the BOD chip. The high-blocking p-n junction is identified by reference numeral 35. If the thyristor 19 is now triggered during the coil charging operation, then charge carriers pass from the p layer 36 into the n layer 37. The charge carriers are shown symbolically, identified by reference numeral 38, in FIG. 5. These charge carriers 38 assure that after the ignition coil charging current is turned off and the thus now-negative secondary-side high voltage occurs, the break-over voltage is reduced. No further triggering for the high-voltage break-over diode, for instance by means of light, is necessary.

Returning to FIG. 1, it can be noted that the first part 15 and the second part 16 of the high-voltage break-over diode HKD differ from one another in that one group of BOD chips has a long charge carrier storage time, while the other group comprises BOD chips with a short charge carrier storage time. Thus the charge carriers 38 are preserved long enough to accomplish a reduction in the break-over voltage only in the part having the long charge carrier storage time. The other part continues to have the function of a break-over diode, which when a predeterminable voltage is reached, namely the break-over voltage, changes abruptly from the blocking to the conducting state and thus exerts a steepening effect on the spark plug.

Figure 2:
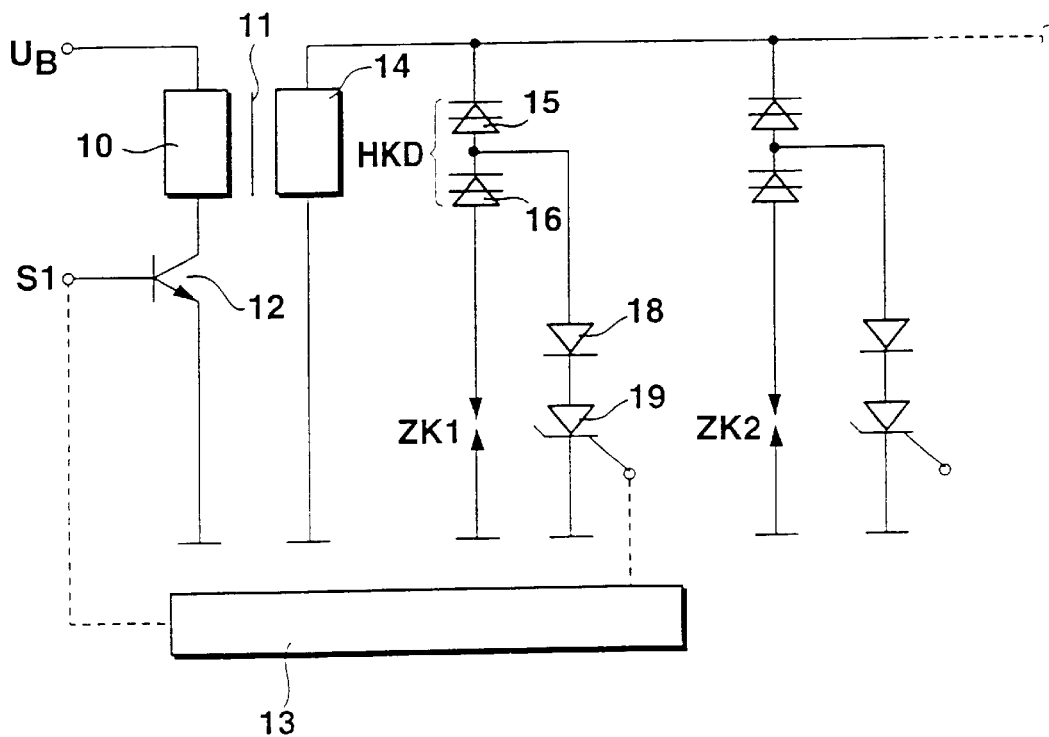

FIG. 2 shows a second exemplary embodiment, which is substantially equivalent to the exemplary embodiment of FIG. 1, and therefore identical elements are provided with the same reference numerals and will not be explained again. The sole difference in FIG. 2 relative to FIG. 1 is that the turn-on spark suppression diode 17 has been omitted. The function of the diode 17 is performed here by the second part 16 of the high-voltage break-over diode HKD. During the trigger pulse to the thyristor 19, a conditioning current flows through the first part 15 of the high-voltage break-over diode, the part having a long charge carrier storage time. The second part 16, like the diode 17 in FIG. 1, assures that during the ignition coil charging operation and during the trigger pulse to the thyristor 19, no current will flow away via any shunts that may be present at the spark plug ZK1. The second part 16 of the high-voltage break-over diode HKD is designed such that it is capable of blocking several kilovolts in the reverse direction.

Figure 3:
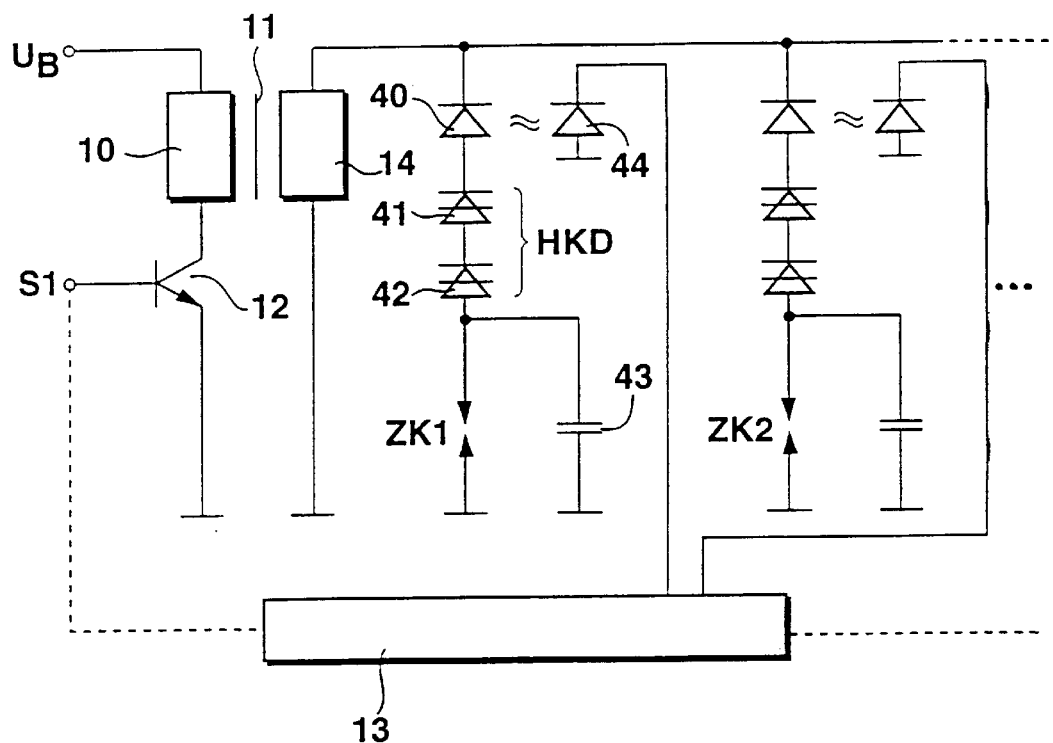

A third exemplary embodiment is shown in FIG. 3. Once again, for the same components the same reference numerals have been used, and the function of these components will not be explained again. Only the high-voltage branch of the secondary coil 14 to the spark plug differs in its embodiment from the exemplary embodiment of FIGS. 1 and 2. Here the high-voltage connection of the secondary coil 14 is connected, via the diode 40 and the reverse-conducting high-voltage break-over diode HKD, which once again comprises a first 41 and a second part 42, to the spark plug ZK1 and parallel to the spark plug ZK1 is connected to a capacitor 43. The spark plug ZK1 and the capacitor are also connected to ground. The photodiode 40 takes on the function of a turn-on spark suppression diode. this photodiode 40 is also assigned a light-emitting diode or LED 44 is also associated with this photodiode 40 in such a way that the blocking voltage of the diode 40 can be reduced by irradiation with light.

The LED 44 is triggered by the control unit 13; once again, analogously to the thyristor, the diode 40 is triggered immediately before the end of the ignition coil charging operation. During the triggering of the LED 44 and thus the diode 40, a conditioning current flows in the reverse direction through the high-voltage break-over diode into the capacitor, until such time as the capacitor is charged; once again, charge carriers 38 are released, which after the ignition transistor is turned off, at the end of the closing time, assure a reduction in the break-over voltage.

We claim:
1. An ignition device for internal combustion engines, having at least one ignition coil (11) comprising a primary winding (10) and secondary winding (14), wherein a controllable switch (12) is disposed in series with the primary winding (10) and is triggerable by a control unit (13), wherein in each secondary-side ignition branch between the high-voltage-side end of the secondary winding (14) and a spark plug (ZK1, ZK2, . . . , ZKn) at least one high-voltage break-over diode (HKD) is disposed, which comprises a plurality of series-connected planar break-over diode chips, and having a controllable switching unit (19, 40) which is in series with the high-voltage break-over diode (HKD) and is triggerable by the control unit (13) during the ignition coil charging operation, so that a conditioning current caused by the positive ignition coil charging current flows in the reverse direction through the high-voltage break-over diode (HKD) and in the high-voltage break-over diode floods the blocking region with charge carriers (38).

2. The ignition device of claim 1, characterized in that the controllable switching unit is connected parallel to the spark plug and comprises a series circuit of a high-voltage diode and a thyristor.

3. The ignition device of claim 2, characterized in that the gate terminal of the thyristor is connected to the control unit (13).

4. The ignition device of claim 1, characterized in that the high-voltage break-over diode (HKD) comprises a first and a second part, wherein one part comprises break-over diode chips with a long charge carrier storage time and the other part comprises break-over diode chips with a short charge carrier storage time.

5. The ignition device of claim 1, characterized in that a diode which is triggerable via an optoelectronic operative connection is connected in series with the high-voltage break-over diode.

6. The ignition device of claim 5, characterized in that the diode is assigned a light-emitting diode, which is connected to the control unit.

* * * * *